United States Patent [19]

Campbell

[11] Patent Number: 5,626,687
[45] Date of Patent: May 6, 1997

[54] THERMOPHOTOVOLTAIC IN-SITU MIRROR CELL

[75] Inventor: Brian C. Campbell, Scotia, N.Y.

[73] Assignee: The United States of America as represented by the United States Department of Energy, Washington, D.C.

[21] Appl. No.: 412,039

[22] Filed: Mar. 29, 1995

[51] Int. Cl.$^6$ ........................................ H01L 31/06
[52] U.S. Cl. ........................ 136/259; 136/253; 257/436
[58] Field of Search .............................. 136/259, 253, 136/262; 257/436

[56] References Cited

U.S. PATENT DOCUMENTS

| | | | |
|---|---|---|---|
| 3,264,707 | 8/1966 | Elie | 437/167 |
| 3,331,707 | 7/1967 | Werth | 136/253 |
| 3,907,595 | 9/1975 | Lindmayer | 136/255 |
| 4,234,352 | 11/1980 | Swanson | 136/253 |
| 4,316,048 | 2/1982 | Woodall | 136/253 |
| 4,395,582 | 7/1983 | Damsker | 136/248 |
| 4,746,370 | 5/1988 | Woolf | 136/246 |
| 4,773,945 | 9/1988 | Woolf et al. | 136/256 |
| 5,057,162 | 10/1991 | Nelson | 136/253 |
| 5,057,163 | 10/1991 | Barnett et al. | 136/258 |
| 5,066,339 | 11/1991 | Dehlsen | 136/253 |
| 5,092,767 | 3/1992 | Dehlsen | 432/181 |
| 5,121,183 | 6/1992 | Ogasawara et al. | 257/21 |
| 5,230,746 | 7/1993 | Wiedeman et al. | 136/249 TJ |
| 5,389,158 | 2/1995 | Fraas et al. | 136/244 |
| 5,476,566 | 12/1995 | Cavasin | 156/249 |

FOREIGN PATENT DOCUMENTS

| 2116775 | 9/1983 | United Kingdom . | |
| WO94/06159 | 3/1994 | WIPO | H01L 31/06 |

OTHER PUBLICATIONS

"Sumitomo III–V Semiconductors" Brochure, Sumitomo Electric Industries, Ltd. Publication date not known.
*Applied Physics Letters,* vol. 43, No. 7, 1 Oct. 1983, Y. Hamakawa et al., "New Types of High Efficiency Solar Cells Based on a–Si", pp. 644–646.
Lush, Gregory Benedict, Ph.D., Purdue University, Aug. 1992. "Recombination and absorption in n-type gallium arsenide." Major Professor: Mark S. Lundstrom.
P.Demeester et al., "Epitaxial lift–off and its applications", Semiconductor Science Technology Magazine (1993), pp. 1124–1135, IOP Publishing Ltd., U.K.

*Primary Examiner*—Aaron Weisstuch
*Attorney, Agent, or Firm*—Virginia B. Caress; William R. Moser; Paul A. Gottlieb

[57] ABSTRACT

A photovoltaic cell used in a direct energy conversion generator for converting heat to electricity includes a reflective layer disposed within the cell between the active layers of the cell and the cell substrate. The reflective layer reflects photons of low energy back to a photon producing emitter for reabsorption by the emitter, or reflects photons with energy greater than the cell bandgap back to the cell active layers for conversion into electricity. The reflective layer can comprise a reflective metal such as gold while the substrate can comprise heavily doped silicon or a metal.

19 Claims, 1 Drawing Sheet

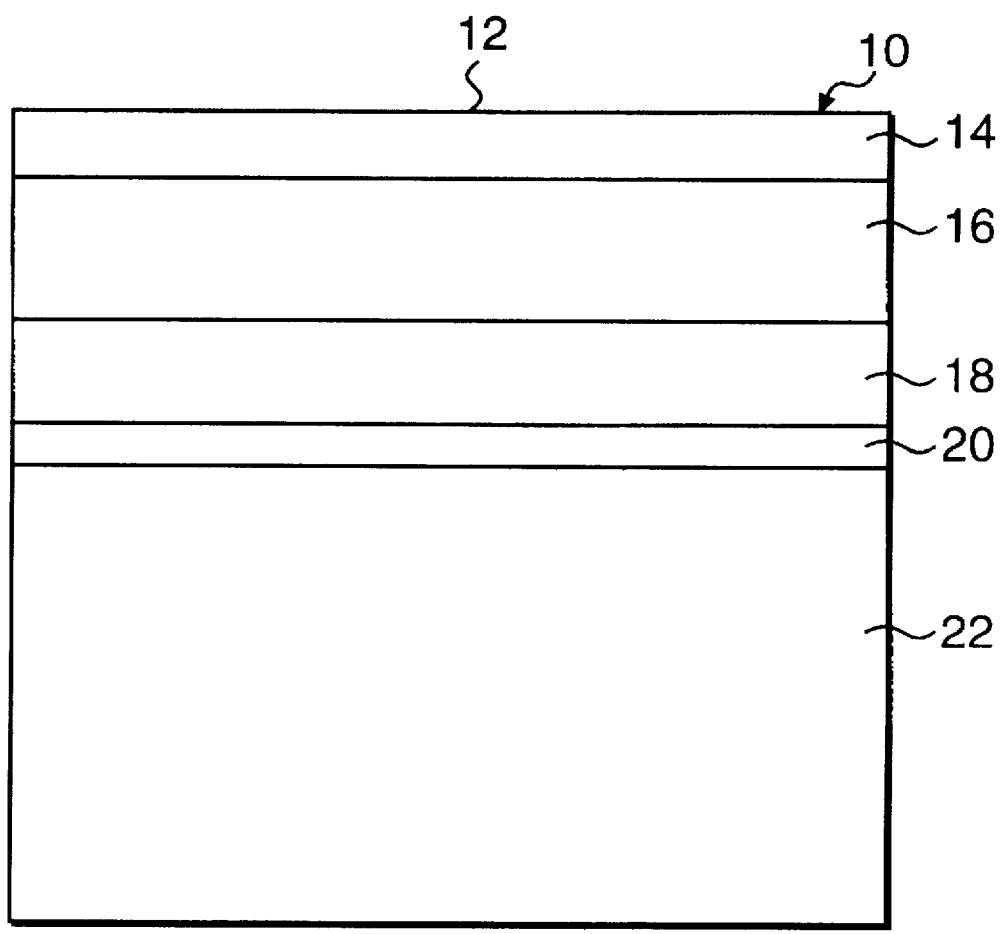

THERMOPHOTOVOLTAIC IN-SITU MIRROR CELL

BACKGROUND OF THE INVENTION

1. Field of the Invention

This invention relates generally to the field of energy conversion, viz., heat to electricity, and, more particularly, to thermophotovoltaic (TPV) energy conversion wherein a heat source radiatively heats a solid-state semiconductor energy conversion device or devices (e.g., photovoltaic cells) which convert the resultant photons into electricity.

2. The Prior Art

Thermophotovoltaic energy conversion of heat to electric power is used as an alternative to classical Rankine steam cycles employed for this general purpose. Thermophotovoltaic systems provide for the conversion of heat into thermal radiation and thereafter into electricity by means of the action of photovoltaic semiconductors.

A high temperature heat source, such as provided by burning of combustion gases or any high temperature fluid, heats an emitter surface which radiatively emits infrared (IR) photons with a spectrum characteristic of the temperature of the heat source. The photons are focused onto a thermophotovoltaic cell which absorbs the photons primarily through electron/hole ($e^-h^+$) creation. The IR photons must be of an energy greater than the difference between the conduction and valence bands of the lattice—referred to as the "band gap"—in order to create an ($e^-h^+$ pair). Otherwise, the photon will be parasitically absorbed, producing heat without electrical power. The mobile charge carriers ($e^-h^+$) drift until they come in contact with the photovoltaic interface (p-n junction field), at which point carriers are accelerated thereby developing a potential difference across the cell which can be used to power an electrical load.

Control of the IR spectrum is required to obtain efficient operation of a thermophotovoltaic system, i.e., the spectrum must be matched to the cell bandgap. Photons with energy below the bandgap energy must be recycled back to the heat source for efficient operation, or never emitted from the heat source. Photons with energies much higher than the bandgap will still produce power, but only the bandgap energy value is recoverable out of the incident energy of the photon, and the remainder is wasted as heat. While high energy photons contribute to the total output power, they decrease the relative efficiency somewhat, and are therefore either suppressed or included depending on the specific application. An ideal system, in terms of spectral matching to the cell bandgap, uses laser-powered photovoltaic energy conversion wherein the incident photon energy is set exactly equal to the cell bandgap. Such systems are being developed and tested for space applications; however, the inefficiency of creating the laser beam ($\leq 10\%$) outweighs the high efficiency with which the cell can convert the spectrally matched incident beam (~60%), rendering these systems unattractive compared to more conventional systems of energy conversion. Still, the importance of matching the spectrum to the cell bandgap is clear.

Thermophotovoltaic power systems have classically suffered from the parasitic losses associated with photons of energy less than the target thermophotovoltaic cell bandgap (hereafter referred to as "low energy photons") being radiated off the hot "emitter" surface and absorbed in the cells, producing waste heat equal to their energy. Typically, 60–80% of the energy radiated by the emitter surface is low energy photons, depending on the choice of bandgap. These photons must be efficiently recycled back to the emitter, and therefore not wasted, in order to achieve acceptable system efficiencies. Classically, spectrally selective filters have began used to reflect these photons at the cell surface back to the emitter. However, fundamental limitations in the reflective bandwidth of such filters result in significant parasitic absorption efficiency losses, since large fractions of the spectrum have energies less than the bandgap. The emitter can also be modified to suppress its emission of such low energy photons. However, as the emissivity of the emitter in the low energy photon region decreases, its reflectivity increases in a complementary fashion. Therefore, even if the filter reflects a low energy photon back to the emitter, the photon may be reflected back off the emitter toward the filter, again and again. With each pass, there is a chance the photon will be parasitically absorbed in either the cell or the structurals. Hence, the benefits of modifying the emitter emissivity to preferentially suppress low energy photon emissions are almost completely nullified. This could change if extremely low emitter emissivities for low energy photons are achieved, but this is currently beyond the state-of-the-art.

A key issue with thermophotovoltaic energy conversion using low bandgaps is the minimization of "dark current." Dark current is the electrical current flow in a thermophotovoltaic (or solar) cell that opposes the useful photon-generated electrical current. The photon-generated current must be increased significantly above the dark current in order to produce useful power in the cell. This can be accomplished by maximizing the incident source photon flux, or minimizing the dark current. The incident photon flux is exponentially proportional to the heat source temperature, which affords the system designer a method of overcoming high dark currents. Lower bandgap cells have inherently higher dark currents, necessitating higher incident photon fluxes to achieve comparable efficiencies. However, dark currents can be reduced by various means. These means include, for example, front surface passivation to lower surface velocities, using high purity precursors, using heterostructures, and mirrored photon recycling to mitigate radiative recombination. In the latter, radiative recombination is a loss mechanism where photo-excited charge carriers degenerate with the release of a photon (typically equal to the bandgap energy) prior to being collected at the p-n junction. This dark current contributor can be quantified by time-resolved photoluminescence (TRPL). Mechanisms by which radiative recombination photons are recycled (reabsorbed in the cell) will show increased charge carrier lifetimes relative to methods that are ineffective at photon recycling.

A further important area for consideration is cell costs. The costs associated with the manufacture of thermophotovoltaic (or solar) cells typically are broken down into three major categories: wafer cost; cell growth costs; and processing and array costs. Regarding the former, the cell must be grown on a structure of sufficient strength to allow handling for cell growth and post-growth processing (discussed below). The wafers are typically made of very high purity crystalline compounds with crystal lattice parameters (characteristic unit crystal dimensions) acceptable to the active cell layers to be grown on the wafer. Wafers typically make up between 30–50% of the total cell cost, mainly due to the fabrication and processing tolerances. With respect to cell growth cost, the cells are typically grown on the wafers using some form of chemical vapor deposition. (Atmospheric Pressure Metalorganic Vapor Phase Epitaxy (APMOVPE) and Molecular Beam Epitaxy (MBE) are common methods. ) The cell layers typically have +/−10 nanometer tolerances in thickness, and similarly demanding uniformity, purity and doping tolerances. This step typically accounts for 30–50% of the total cell costs. Development costs are significant for new material systems.

Regarding processing and array costs, once a photovoltaic wafer is grown, electrical contacts must be added (commonly using photolithography), the wafers must be cut into individual cells, and the cells mounted and wired into arrays. This step typically accounts for up to 30% of the cell costs.

Thermophotovoltaic spectral control costs (e.g., filtration, emissivity modification, and the like) can also make up a significant fraction of the total cell costs, especially for thermophotovoltaic systems, wherein spectral control accounts for upwards of a 200–300% relative efficiency difference, and, therefore, warrants state-of-the-art spectral control techniques. However, in a production mode, spectral control costs will not be expected to exceed 30% of cell costs.

The application of thermophotovoltaic direct energy conversion has received relatively little attention for a number of reasons. First, there are limited applications due to high costs, viz., cell, spectral control, structural, and optics costs. Second, there has been lack of viable low bandgap thermophotovoltaic cell materials, at least up until recently. Third, there are problems with energy losses, primarily associated with the absorption of low energy photons that do not produce electricity (poor spectral control). In particular, typical thermophotovoltaic system operating temperatures (<1500° C.) require a low bandgap thermophotovoltaic cell (at or below 0.6 eV) to match the relatively cool emitter spectrum, and thereby achieve both high efficiency conversion (>25%) and high surface power density (>1 amp/cm$^2$ out of cell). To date, no low bandgap photovoltaic power cells have been produced for these temperature ranges, although several have been made that are close (e.g., Germanium 0.67 eV, National Renewable Energy Lab (NREL) InGaAs 0.75 eV, and Boeing Corporation GaSb 0.7 eV).

SUMMARY OF THE INVENTION

In accordance with the invention, a photovoltaic cell is provided for use in a thermophotovoltaic direct energy conversion generator for converting heat to electricity which affords a number of important advantages as compared with the prior art discussed above and hereinafter.

According to the invention, a highly reflective layer is incorporated within the thermophotovoltaic cell, between the substrate of the cell and the active layers thereof, which serves as a mirror for reflecting low energy photons back to the emitter of the system for reabsorption by the emitter and to thus provide recycling of the photons. The reflective or mirror layer reflects a very high fraction (preferably, greater than 95%) of the photons passing "down" through the cell active layers, back "upwardly" through these active cell layers for a second pass. If any of these reflected photons have energies greater than the cell bandgap, these photons have a second chance of being absorbed and converted into useful power. However, if the energies of the reflected photons are less than the bandgap the photons will pass out of the cell (through an antireflection coating) and be absorbed by the emitter (assuming a "black" emitter), and thereby be recycled.

In a preferred embodiment, the active layers provide a p-n junction, and advantageously comprise a n-type active cell layer, a p-type active cell layer and a buffer layer in a sandwich construction, all three layers being epitaxial layers.

In one embodiment, the mirror layer is incorporated into the cell using mechanical cell processing while in an advantageous, alternative embodiment, a direct deposition method is used wherein the reflective layer is modified (e.g., doped) to retain the substrate crystalline properties thereof, thereby enabling epitaxial deposition of the reflective (mirror) layer and growth on top of this reflective layer.

Among other advantages of the invention (some of which are discussed in more detail below), the invention provides significant direct benefits with respect to thermophotovoltaic system efficiency and, potentially, with respect to cost reduction in such systems by eliminating costly filters and other spectral control processing and by potentially enabling substrate recycling. Although cell fabrication will likely be more complicated with attendant cost increases, this may be mitigated during actual production and may not be a factor with epitaxial deposition of the reflective layer.

Other features and advantages of the invention will be set forth in, or apparent from, the following detailed description of preferred embodiments of the invention.

BRIEF DESCRIPTION OF THE DRAWINGS

The single FIGURE in the drawing is a cross sectional view of a preferred embodiment of the in-situ mirror cell of the invention.

DESCRIPTION OF THE PREFERRED EMBODIMENTS

Referring to the single FIGURE of the drawings, there is shown a cross section of a thermophotovoltaic in-situ mirror cell which is generally denoted 10 and which is constructed in accordance with a preferred embodiment of the invention. The cell 10 includes a cell grid on surface 12 forming the cell front contact, an n-type active cell layer 14, a p-type active cell layer 16, a buffer layer 18, an ohmic reflective interface or mirror layer 20, and a final substrate 22 forming the cell back contact. Layers 14, 16 and 18 are epitaxial cell layers in this embodiment, while the final substrate 22 is added after cell growth.

Although these thickness are exemplary and non-limiting, the preferred nominal thicknesses are as follows, as expressed in micrometers (10$^{-6}$ meters), n-type active cell layer 14, less than 0.1; p-type active cell layer 16, 3 to 10; buffer layer 18, 3 to 5; ohmic reflective interface 20, less than 0.1; and substrate 22, 100 to 200.

As discussed above, a key feature of the invention concerns the incorporation in cell 10 of the thin (less than 10 micrometers) mirror layer 20 between photovoltaic cell substrate 22 and the active (p-n junction) layers 14, 16 of the cell. The mirror layer 20, which is preferably made of gold or gold alloy or some other chemically inert, highly reflective material, such as silver, platinum, copper, palladium, aluminum, and alloys thereof, can be doped as appropriate for the semiconductor layers it contacts, using standard grid deposition technology. The upper surface of the mirror layer 20 (adjacent to the p-n junction formed layers 14 and 16 and next to buffer layer 18) should be smooth to provide good IR reflectivity. The semiconductor layers 14, 16 and 18 adjacent to the mirror layer 20 should be highly doped to preclude forming a Schottky-barrier and thus avoid the associated electrical losses.

The deposition of a mirror layer 20 between the cell substrate 22 and the active layers can be accomplished using the techniques described below, although other processing methods can also be used to achieve the same end-product. Three examples will be considered.

Method 1:
i) Grow the active cell layers 14, 16 and 18 (single or tandem, any design desired) on an epitaxially matched single crystal substrate witch a sacrificial layer (not shown) from a different material system at the desired point of separation, preferably between any graded layers and the heavily doped buffer layer 18. It is noted that substrate-to-active-layer lattice mismatch can be taken up with graded layers.

ii) Attach a temporary handling disc to the top surface 12 of the wafer using an etchant-resistant adhesive, e.g., Apiezion Black Wax.

iii) Selectively etch (e.g., using dilute HF or Acetic acid) away the sacrificial layer, separating the cell substrate from the active layers. Ensure that the exposed surface is clean, if not polished.

iv) Deposit a gold (or other highly reflective) layer, corresponding to layer 20, onto the exposed heavily doped buffer layer (18). The mirror layer 20 should be thick enough to prevent photon transmission (nominally 0.1 μm).

v) Attach an appropriate substrate 22 to the mirror layer 20. The substrate can be either semiconductor material, e.g., heavily doped silicon, or a metal, depending on the final cell separation techniques to be employed.

vi) Dissolve the adhesive (Black Wax) and remove the temporary handling disc.

vii) Deposit anti-reflection coatings (not shown) or cover glasses (not shown) as desired. Note that this can be done in step i above if desired.

Method 2:
i) Grow the active cell layers (single or tandem, any design desired) in an inverted fashion (e.g., top layer 14 first) on an epitaxially matched single crystal substrate, ending in a heavily doped buffer layer corresponding to layer 18. The substrate-to-active-layer lattice mismatch can be taken up with grated layers prior to the deposition of the final cell top layer, although, if grated layers are used, they must be etched off of the final wafer product. No graded layers are required between the cell bottom layers and the forthcoming mirror layer (layer 20). Again, a sacrificial layer (not shown) is included between any graded layers and the emitter (or front surface passivation) layer.

ii) Deposit a gold (or other highly reflective) layer (corresponding to layer 20), onto the exposed buffer layer 18. The mirror layer 20 should be thick enough to prevent photon transmission (nominally 0.1 μm).

iii) Attach an appropriate substrate 22 to the mirror layer 20. Again, this can be either semiconductor material, e.g., heavily doped silicon, or a metal.

iv) Selectively etch away (e.g., using an appropriate acid solution) the sacrificial layer until cell top layers are exposed (and the graded layers are removed). Ensure that the exposed surface is clean.

v) Deposit anti-reflection coatings or cover glasses as desired.

Method 3:
i) Grow a heavily doped buffer layer on an epitaxial substrate.

ii) Deposit the IR mirror layer 20, heavily doped with an epitaxial crystalline dopant, on the doped buffer layer until an IR mirror layer of experimentally determined effective thickness is established. The dopant concentration must be maintained above a minimum value, below which the layer will lose its crystallinity.

iii) Deposit a heavily doped buffer layer 18 on the heavily doped, crystalline mirror layer 20, and complete the cell growth in accordance with normal processing.

It is noted that temperature variations may be required during processing in order to prevent mirror layer metals from diffusing into the active cell layers.

One of the important advantages of the present invention is that it increases thermophotovoltaic conversion efficiency as compared with prior art and state-of-the art devices in a number of ways. The invention recycles low energy photons more efficiently than either state-of-the-art short-pass blocking filters, or tailored emitters designed to suppress low energy photon emission, or combinations of both. Further, the invention eliminates the dark current contribution associated with graded layers between non-epitaxially matched substrates and active cell layers. The p-n junction layers closest to the mirror layer 20 can be reduced in thickness by upwards of half, since the useful high energy photons that transmit through the junction will reflect back up for a second pass. Further, the two-pass advantage will increase the near bandgap photon absorption (and hence the quantum efficiency and overall efficiency), since the cell spectral photon absorption coefficient drops off near bandgap. Further, the in-situ mirror cell of the invention will lower dark current through radiative recombination photon recycling.

Another advantage is in the area of costs. The invention lowers costs versus state-of-the-art concepts by, among other things, eliminating costly filters, achieving very high efficiency spectral control, thereby improving overall cycle efficiency with commensurate design cost and system fuel cost savings, and eliminating costly emitter emissivity tailoring. In addition, the invention potentially precludes the need for epitaxially matching wafer-substrates and active p-n junction cell layers, thereby allowing use of the least expensive wafers (or metal) obtainable (typically silicon). This assumes a graded layer can be used to accommodate any lattice mismatch during the growth run, and that the graded layer is etched away during processing.

It is noted that the low energy photon recycling provided by the invention is superior to "back contact reflector" (BCR) based thermophotovoltaic cells. BCR cells rely on their metallic back electrical contacts to act as mirrors in a broadly similar fashion to the mirror of the invention, where the low energy photons reflect off the back contact, pass through the cell and emerge toward the emitter. However, state-of-the-art BCR cells are predicted to be several times less efficient at recycling photons than the cells of the invention for a number of reasons.

First, the distance a low energy (less than the bandgap) photon must travel to successfully be recycled back to the emitter is twice the distance between the cell surface (entry point) and the mirror layer. The difference in this distance between the BCR and the in-situ mirror cell of the invention is the thickness of the substrate, since the mirror layer 20 of the invention is deposited between the substrate 22 and the active layers 14, 16 and 18. The substrate (which is typically about 100 to 300 micrometers in thickness) is about two orders of magnitude thicker than the active cell layers (typically about 3 micrometers). Therefore, since the product of the low energy photon absorption coefficient and the travel distance is logarithmically proportional to the total absorption, the cell of the invention is upwards of three times more efficient at recycling the photons than BCR-based cells.

Second, the substrate layer is highly doped to lower its resistivity, and hence total electrical circuit losses, whereas the active layers are doped one or two orders of magnitude lighter in order to optimize charge carrier lifetimes (which the cell of the invention will potentially increase 3–10 times, as previously demonstrated for solar cells) and hence collection efficiencies. However, the low energy photon absorption coefficient is proportional to the doping in the cell layers the photon passes through. Therefore, for most cell architectures, the substrate will have a higher absorption coefficient than the active layers, further reducing the BCR low energy photon recycling efficiency compared to the invention. Further, the cell substrate of the invention can be metallic without optical penalty.

The invention also provides important advantages over filtered systems. Such filtered systems have been tested for thermophotovoltaic application since the 1970's and without exception have shown significant efficiency losses due to low energy photon absorption. In particular, interference filters can be designed to both pass high energy photons and reflect low energy photons, with the transition centered at a certain wavelength typically corresponding the cell bandgap. However, the physics of interference filters limit the bandwidths which can be made to efficiently pass or block any portion of the spectrum. Typically, such filters very efficiently pass photons with wavelengths between the cell bandgap, ($\lambda_{bandgap}$) and ½ $\lambda_{bandgap}$, and very efficiently reflect photons between $\lambda_{bandgap}$ and $2\lambda_{bandgap}$. Photons with energies below $2\lambda_{bandgap}$ transmit into the cell and are parasitically absorbed. The fraction of the total emitter spectrum below $2\lambda_{bandgap}$ can be up to half of the fraction with energy greater than $\lambda_{bandgap}$, effectively halving the total system efficiency, or worse.

The efficiency with which the invention recycles low energy photons is primarily a function of the reflectivity of the mirror layer. Gold is highly reflective in the IR region, upwards of 98%, with silver and aluminum being comparable.

Although performance improvement can be realized by combining a tailored emitter (e.g. tailored using Ion Beam Assisted Deposition (IBAD)) with a filter, the net performance is believed to be inferior to the use of the invention alone. Further, both the filter and IBAD technology must be advanced beyond the state-of-the-art to compete with the reflectivity provided by the inventive thermophotovoltaic cell, and this would entail commensurate costs for incorporating two technologies into the system.

Although the present invention has been described relative to specific exemplary embodiments thereof, it will be understood by those skilled in the art that variations and modifications can be effected in these exemplary embodiments without departing from the scope and spirit of the invention.

What is claimed is:

1. A photovoltaic cell for use in a direct energy conversion thermophotovoltaic generator for converting heat to electricity, said generator including an emitter for emitting infrared photons which are received by said cell, said cell consisting essentially of:

a plurality of single crystal infrared-sensitive active semiconductor layers having a low energy bandgap of about 0.75 eV or less; said active layers having a total thickness of about 3–10 micrometers;

a substrate; and a reflective layer comprising a metal selected from the group consisting of gold, silver, platinum, copper, palladium, aluminum, and alloys thereof, said reflective layer being disposed within the cell between the rearmost of said active layers and the substrate for reflecting infrared photons of energy below the energy bandgap back to the emitter for reabsorption whereby and for reflecting infrared photons of energy greater than the energy bandgap back to the active layers for conversion into electricity.

2. A photovoltaic cell for use in a direct energy conversion thermophotovoltaic generator according to claim 1, wherein said active layers include a p-n junction.

3. A photovoltaic cell for use in a direct energy conversion thermophotovoltaic generator according to claim 1, further comprising a buffer layer between said reflective layer and said active layers.

4. A photovoltaic cell for use in a direct energy conversion thermophotovoltaic generator according to claim 1, wherein said reflective layer comprises a gold layer.

5. A photovoltaic cell for use in a direct energy conversion thermophotovoltaic generator according to claim 1, wherein said active layers comprise, in sequence, an n-type active layer, a p-type active layer in contact with said n-type active layer, and a doped buffer layer in contact with said p-type active layer and with said reflective layer.

6. A photovoltaic cell for use in a direct energy conversion thermophotovoltaic generator according to claim 5, wherein said active layers are doped in an amount that precludes formation of a Schottky-barrier.

7. A photovoltaic cell for use in a direct energy conversion thermophotovoltaic generator according to claim 1, wherein the thickness of said reflective layer is less than 10 micrometers.

8. A photovoltaic cell for use in a direct energy conversion thermophotovoltaic generator according to claim 1, wherein said substrate comprises heavily doped silicon.

9. A photovoltaic cell for use in a direct energy conversion thermophotovoltaic generator according to claim 1, wherein said substrate comprises a metal.

10. A thermophotovoltaic cell consisting essentially of:

a) a single-crystal, infrared-sensitive semiconductor active layer; said semiconductor active layer having a thickness of about 3–10 micrometers an energy bandgap of about 0.75 eV or less;

b) a metallic, infrared-reflective layer adjacent to said semiconductor active layer; and c) a substrate directly adjacent to said metallic layer, such that said metallic layer is positioned between said semiconductor active layer and said substrate.

11. The thermophotovoltaic cell of claim 10 wherein said semiconductor active layer comprises an n-type active cell layer and a p-type active cell layer.

12. The thermophotovoltaic cell of claim 11 further comprising a buffer layer between said semiconductor active layer and said metallic layer.

13. The thermophotovoltaic cell of claim 12 wherein said semiconductor active layer and said buffer layer are grown on an epitaxially matched single crystal substrate with a sacrificial layer.

14. The thermophotovoltaic cell of claim 12 wherein said buffer layer is a semiconductor and said buffer layer forms an ohmic interface with said metallic layer.

15. The thermophotovoltaic cell of claim 11 wherein said semiconductor active layer is about 3 micrometers thick.

16. The thermophotovoltaic cell of claim 10 wherein said metallic layer comprises a metal selected from the group consisting of gold, silver, platinum, copper, palladium, aluminum, and alloys thereof.

17. The thermophotovoltaic cell of claim 10 wherein said metallic layer is about 0.1 micrometer thick.

18. The thermophotovoltaic cell of claim 10 wherein said metallic layer is selected from gold and gold alloy.

19. A thermophotovoltaic cell comprising in sequence:
a) a single-crystal, infrared-sensitive semiconductor active layer having a bandgap energy of about 0.75 eV or less, said layer comprising a p-type semiconductor next to an n-type semiconductor;
b) a metallic, infrared-reflective layer adjacent to said semiconductor active layer;
c) a substrate adjacent to said metallic layer, wherein said substrate is made from material selected from metals and semiconductor material; and wherein said active layer, said metallic layer, and said substrate are epitaxial layers.

* * * * *

UNITED STATES PATENT AND TRADEMARK OFFICE
CERTIFICATE OF CORRECTION

PATENT NO. : 5,626,687
DATED : May 6, 1997
INVENTOR(S) : Brian C. Campbell

It is certified that error appears in the above-indentified patent and that said Letters Patent is hereby corrected as shown below:

In column 1, line 8, delete "CTPV)" and subsitute therefor -- (TPV)--;
In column 2, line 3, delete "began" and subsitute therefor --been--.
In column 5, line 4, delete "witch" and subsitute therefor --with--.
In column 5, lines 37 and 38, delete "grated" and subsitute therefor --graded--.
In column 8, line 2, delete "whereby" and subsitute therefor --thereby--;
In column 8, line 38, add --and-- after "micrometers".

Signed and Sealed this

Twelfth Day of August, 1997

Attest:

BRUCE LEHMAN

Attesting Officer

Commissioner of Patents and Trademarks